(12) United States Patent
Tanaka

(10) Patent No.: US 6,763,510 B2
(45) Date of Patent: Jul. 13, 2004

(54) AUTOMATIC PLACEMENT AND ROUTING APPARATUS

(75) Inventor: Genichi Tanaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 174 days.

(21) Appl. No.: 10/193,322

(22) Filed: Jul. 12, 2002

(65) Prior Publication Data

US 2003/0046650 A1 Mar. 6, 2003

(30) Foreign Application Priority Data

Sep. 6, 2001 (JP) ........................................ 2001-270621

(51) Int. Cl.[7] .............................................. G06F 17/50
(52) U.S. Cl. .............................. 716/11; 716/2; 716/10; 716/12
(58) Field of Search .............................. 716/1–2, 8–14

(56) References Cited

U.S. PATENT DOCUMENTS 5,984,510 A * 11/1999 Guruswamy et al. .......... 716/2
6,584,605 B1 * 6/2003 Zahar .......................... 716/10

FOREIGN PATENT DOCUMENTS

| JP | 6-52248 | 2/1994 |
| JP | 2001-43252 | 2/2001 |
| JP | 2001-57387 | 2/2001 |

* cited by examiner

Primary Examiner—Leigh M. Garbowski
(74) Attorney, Agent, or Firm—Burns, Doane, Swecker & Mathis, L.L.P.

(57) ABSTRACT

Distinguishing information that differentiates one portion with a port located on a boundary of a logic layer on a net crossing the logic layer as the boundary from another portion is added to each of the portions (step ST2). Each time a cell forming a specific region of a logic circuit is laid out, a layout of the logic circuit in that region is analyzed, a logic optimization is executed to rewrite the net list of the logic circuit in that region so as not to alter the number of ports located on the boundary of the logic layer by using the distinguishing information, and the layout of the logic circuit in that region is modified on the basis of the rewritten net list (step ST3).

6 Claims, 10 Drawing Sheets

US 6,763,510 B2

AUTOMATIC PLACEMENT AND ROUTING APPARATUS

BACKGROUND OF THE INVENTION

1. Field of the Invention

The present invention relates to an automatic placement and routing apparatus, automatic placement and routing method, and automatic placement and routing program that are of use for designing a semiconductor integrated circuit.

2. Description of the Prior Art

FIG. 10 is a block diagram illustrating a conventional automatic placement and routing apparatus. In FIG. 10, there are shown a net list 101, constraint information 102, a library 103, a read means 104, a placement means 105, a logic optimization means 106, and a routing means 107. In the net list 101, specified are information concerning cells constituting a logic circuit, information concerning nets defining connectional relations between the cells of the logic circuit, and information concerning logic layers that divide the logic circuit into an appropriate size. The constraint information 102 defines various constraints on logic circuits, such as routing delay, power consumption, and signal integrity. The library 103 registers the cells used for designing the layout of a logic circuit. The read means 104 reads the net list 101 and the constraint information 102. The placement means 105 places the cells registered in the library 103 on the basis of the net list 101. The logic optimization means 106 analyzes, each time a cell forming a specific region of a logic circuit is arranged by the placement means 105, the layout of the logic circuit in that region, performs a logic optimization that rewrites the net list 101 of the logic circuit in that region so as to satisfy the constraints defined in the constraint information 102, and modifies the layout of the logic circuit in that region on the basis of the rewritten net list. The routing means 107 routes, after the logic optimization means 106 performs a logic optimization and a layout modification over the entire logic circuits, the cells so as to satisfy the connectional relations defined in a net list 108 of all the rewritten logic circuits. The logic optimization means 106 outputs the net list 108 of all the rewritten logic circuits.

Next, the operation will be described.

FIG. 11 is a flow chart for a conventional automatic placement and routing method.

First, the read means 104 reads the net list 101 and the constraint information 102 (step ST101).

Thereafter, the placement means 105 fetches the net list 101 from the read means 104. Then, on the basis of the net list 101, the placement means 105 places the cells registered in the library 103. Also, the logic optimization means 106 fetches the net list 101 and the constraint information 102 from the read means 104. In addition, each time a cell forming a specific region of a logic circuit is arranged by the placement means 105, the logic optimization means 106 analyzes the layout of the logic circuit in that region, performs a logic optimization that rewrites the net list 101 of the logic circuit in that region so as to satisfy the constraints defined in the constraint information 102, and modifies the layout of the logic circuit in that region on the basis of the rewritten net list (step ST102). The net list 101 is rewritten when anew cell and net, for example, are added.

After the logic optimization means 106 performs the logic optimization and the layout modification over the entire logic circuits, the routing means 107 routes the cells so as to satisfy the connectional relations defined in the net list 108 of all the rewritten logic circuits (step ST103).

Thereafter, the logic optimization means 106 outputs the net list 108 of all the rewritten logic circuits (step ST104).

The steps ST103 and ST104 may be replaced in the order.

FIG. 12 illustrates an example of the contents defined in the net list of a logic circuit before a logic optimization in the conventional example. In FIG. 12, there are shown a first to a fourth buffer circuit cell 111 to 114 constituting the logic circuit, a logic layer 115 furnished with the first buffer circuit cell 111 and the second buffer circuit cell 112, a net 116 that crosses the logic layer 115, and a port 117 that is located on the boundary of the logic layer 115 where the net 116 passes through. The net 116 represents that the second through fourth buffer circuit cells 112 to 114 are connected to one another in parallel, and the first buffer cell 111 is connected in series to the second through fourth circuit buffer cells 112 to 114.

FIG. 13 illustrates an example of the contents defined in the net list of a logic circuit after a logic optimization in the conventional example. In FIG. 13, there are shown a newly added buffer circuit cell 118 that is added to the net 116 in order to improve the routing delay from the first buffer circuit cell 111 to the second buffer circuit cell 112 and the third buffer circuit cell 113, a newly net 119 produced by the buffer circuit cell 118 being added to the net 116, and a newly port 120 produced by the buffer circuit cell 118 being added to the net 116, located on the boundary of the logic layer 115 where the net 119 passes through. The other components are identical or equal to those illustrated with the same symbols in FIG. 12, and the detailed explanations will be omitted. The net 116 represents that the first buffer circuit cell 111 and the fourth buffer circuit cell 114 and the added buffer circuit cell 118 are in the connectional relation; and the net 119 represents that the added buffer circuit cell 118 and the second buffer circuit cell 112 and the third buffer circuit cell 113 are in the connectional relation.

Thus, in some cases, the conventional automatic placement and routing apparatus and automatic placement and routing method may increase the number of the ports located on the boundary of the logic layer 115 through the process of a logic optimization. Therefore, there can be a case that the same test pattern cannot be used before and after a logic optimization, which presents a problem of effective use of the test patterns.

SUMMARY OF THE INVENTION

The present invention has been made in view of the foregoing, and an object of the invention is to provide an automatic placement and routing apparatus and automatic placement and routing method that performs a logic optimization so as not to alter the number of ports located on the boundary of a logic layer, and an automatic placement and routing program that makes a computer perform such a logic optimization function.

According to a first aspect of the present invention, there is provided an automatic placement and routing apparatus including: a placement means that places cells registered in a library, on the basis of logic circuit information in which are specified information concerning the cells constituting a logic circuit, information concerning nets defining connectional relations between the cells constituting the logic circuit, and information concerning logic layers that segment the logic circuit into appropriate sizes; a routing means that routes the cells so as to satisfy connectional relations defined in the logic circuit information; a distinguishing information adding means that analyzes the logic circuit information, and adds distinguishing information that differentiates one portion with a port located on a boundary of a logic layer on a net crossing the logic layer as the boundary from another portion to each of the portions; and a logic optimization means that executes a logic optimization to rewrite the logic circuit information, in such a manner that the number of ports located on the boundary of the logic layer is not altered by using the distinguishing information.

Therefore, the same test patterns before and after the logic optimization is available, resulting in an effective use of the test patterns.

According to a second aspect of the present invention, there is an automatic placement and routing method including: a placement step that places cells registered in a library, on the basis of logic circuit information in which are specified information concerning the cells constituting a logic circuit, information concerning nets defining connectional relations between the cells constituting the logic circuit, and information concerning logic layers that segment the logic circuit into appropriate sizes; a routing step that routes the cells so as to satisfy connectional relations defined in the logic circuit information; a distinguishing information adding step that analyzes the logic circuit information, and adds distinguishing information that differentiates one portion with a port located on a boundary of a logic layer on a net crossing the logic layer as the boundary from another portion to each of the portions; and a logic optimization step that executes a logic optimization to rewrite the logic circuit information, in such a manner that the number of ports located on the boundary of the logic layer is not altered by using the distinguishing information.

Therefore, the same test patterns before and after the logic optimization is available, resulting in an effective use of the test patterns.

According to a third aspect of the present invention, an automatic placement and routing program makes a computer perform: a placement function that places cells registered in a library, on the basis of logic circuit information in which are specified information concerning the cells constituting a logic circuit, information concerning nets defining connectional relations between the cells constituting the logic circuit, and information concerning logic layers that segment the logic circuit into appropriate sizes; a routing function that routes the cells so as to satisfy connectional relations defined in the logic circuit information; a distinguishing information adding function that analyzes the logic circuit information, and adds distinguishing information that differentiates one portion with a port located on a boundary of a logic layer on a net crossing the logic layer as the boundary from another portion to each of the portions; and a logic optimization function that executes a logic optimization to rewrite the logic circuit information, in such a manner that the number of ports located on the boundary of the logic layer is not altered by using the distinguishing information.

Therefore, the automatic placement and routing program makes it possible to use a computer as an automatic placement and routing apparatus that can use the same test patterns before and after a logic optimization, resulting in using effectively the test patterns. In addition, the automatic placement and routing program allows a computer to perform an automatic placement and routing method capable of using the same test patterns before and after the logic optimization, resulting in using effectively the test patterns.

DETAILED DESCRIPTION OF THE PREFERRED EMBODIMENTS

An embodiment of the present invention will be described below.

Embodiment 1

Figure 1:
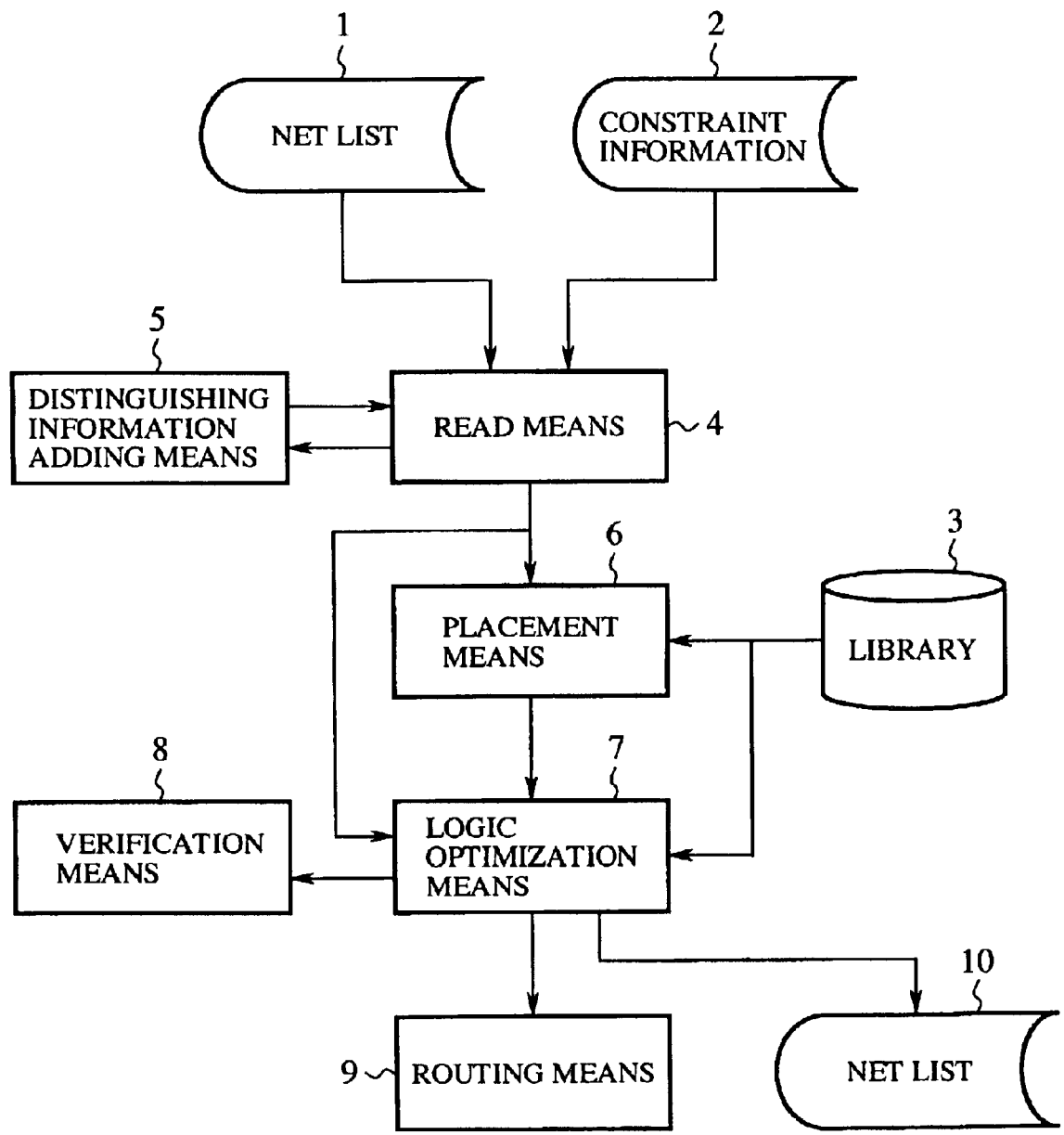
FIG. 1 is a block diagram illustrating an automatic placement and routing apparatus according to an embodiment 1 of the present invention.

FIG. 1 illustrates a block diagram of the automatic placement and routing apparatus according to an embodiment 1 of the present invention. In FIG. 1, there are shown a net list (logic circuit information) 1, constraint information 2, a library 3, a read means 4, a distinguishing information adding means 5, a placement means 6, a logic optimization means 7, a verification means 8, and a routing means 9. In the net list 1, specified are information concerning cells which constitutes a logic circuit, information concerning nets defining a connection relation between the cells constituting the logic circuit, and information concerning logic layers that segment the logic circuit into appropriate sizes. The constraint information 2 defines various constraints on the logic circuit, such as routing delay, power consumption, and signal integrity. The library 3 registers the cells used for designing the layout of a logic circuit. The read means 4 reads the net list 1 and the constraint information 2. The distinguishing information adding means 5 analyzes the net list 1, and adds distinguishing information that differentiates one portion from another portion to the respective portions, which are defined by a port as a boundary located on the boundary of a logic layer on a net crossing the logic layer. The placement means 6 places the cells registered in the library 3 on the basis of the net list 1. The logic optimization means 7 analyzes that, each time a cell forming a specific region of a logic circuit is arranged by the placement means 6, the layout of the logic circuit in that region, executes a logic optimization that rewrites the net list 1 of the logic circuit in that region so that the number of ports located on the boundary of the logic layer is never altered by the distinguishing information, and various constraints defined in the constraint information 2 are satisfied, and modifies the layout of the logic circuit in that region on the basis of the rewritten net list. The verification means 8 verifies that the logic optimization has not altered the number of the ports located on the boundary of the logic layer. The routing means 9 routes, after the logic optimization means 7 executes a logic optimization and a layout modification over the entire logic circuits, the cells so as to satisfy the connectional relations defined in a net list (logic circuit information) 10 of all the rewritten logic circuits. The logic optimization means 7 outputs the net list 10 of all the rewritten logic circuits.

Specifically, when a logic optimization adds a cell to a net crossing the logic layer, the logic optimization means 7 executes a logic optimization in such a manner that only the cell connected to a portion of the net having the same distinguishing information as that of the net where the cell is added is located on the post stage of the added cell. In other words, when a logic optimization adds a cell to a net crossing the logic layer, the logic optimization means 7 executes a logic optimization in such a manner that only the cell contained in the logic layer where the cell is added is located on the post stage of the added cell.

Alternatively, when a logic optimization adds a cell to a net crossing the logic layer, the logic optimization means 7 executes a logic optimization so that one portion and another portion are not divided at the respective nodes where these portions have different distinguishing information by a port as a boundary located on the boundary of the logic layer in the net. In other words, when the logic optimization adds a cell to a net crossing the logic layer, the logic optimization means 7 executes the logic optimization so that the signal transmission paths to the respective cells contained in the logic layers are not changed.

Next, the operation will be described.

Figure 2:
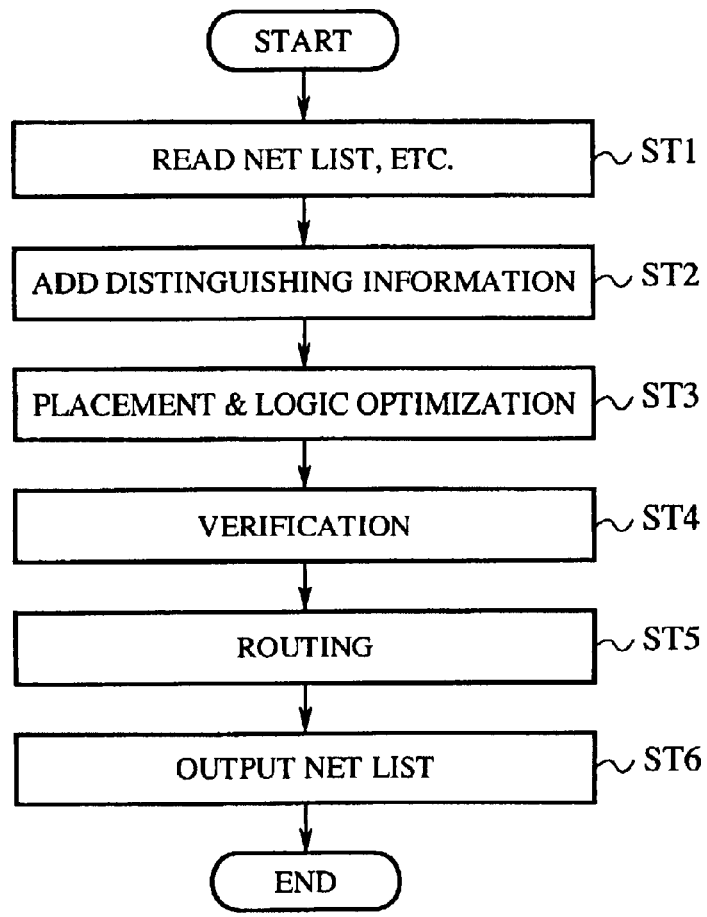
FIG. 2 is a flow chart illustrating an automatic placement and routing method according to the embodiment 1 of this invention.

FIG. 2 illustrates a flow chart for an automatic placement and routing method according to the embodiment 1 of the invention.

First, the read means 4 reads the net list 1 and the constraint information 2 (step ST1).

Thereafter, the distinguishing information adding means 5 fetches the net list 1 from the read means 4. After that, the means 5 analyzes the net list 1, and adds distinguishing information that differentiates one portion from another portion to the respective portions, which are defined by a port as a boundary located on the boundary of a logic layer on a net crossing the logic layer (step ST2).

Thereafter, the placement means 6 fetches the net list 1 from the read means 4. Subsequently, on the basis of the net list 1, the means 6 places the cell registered in the library 3. Also, the logic optimization means 7 fetches the net list 1 and the constraint information 2 from the read means 4. Each time the placement means 6 places a cell forming a specific region of a logic circuit, the logic optimization means 7 analyzes the layout of the logic circuit in that region, executes a logic optimization that rewrites the net list 1 of the logic circuit in that region, so that the number of ports located on the boundary of the logic layer is never altered by the distinguishing information and various constraints defined in the constraint information 2 are satisfied, and modifies the layout of the logic circuit in that region on the basis of the rewritten net list (step ST3). The net list 1 can be rewritten, for example, by adding new cell and net. The layout of the logic circuit can be modified, for example, by an arrangement of a new cell.

Subsequently, the verification means 8 verifies that the logic optimization has not altered the number of the ports located on the boundary of the logic layer (step ST4).

After the logic optimization means 7 executes a logic optimization and a layout modification over the entire logic circuits, the routing means 9 routes the cells so as to satisfy the connectional relation defined in the net list 10 of the entire rewritten logic circuit (step ST5).

Subsequently, the logic optimization means 7 outputs the net list 10 of all the rewritten logic circuits (step ST6).

The step ST5 and ST6 may be replaced in the order.

Figure 3:
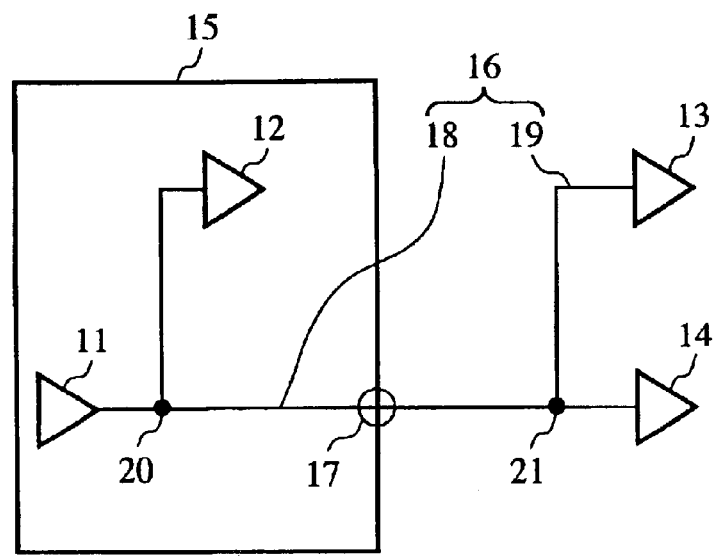
FIG. 3 is a diagram illustrating an example of the contents defined in the net list of a logic circuit before a logic optimization in this invention.

FIG. 3 illustrates an example of the contents defined in the net list of a logic circuit before a logic optimization in this invention. In FIG. 3, there are shown a first to a fourth buffer circuit cell 11 to 14 constituting the logic circuit, a logic layer 15 that contains the first buffer circuit cell 11 and the second buffer circuit cell 12, a net 16 that crosses the logic layer 15, a port 17 that is located on the boundary of the logic layer 15 where the net 16 passes through, a first portion 18 of the net 16 with the port 17 as a boundary, inside the logic layer 15, a second portion 19 of the net 16 with the port 17 as a boundary, which exists outside the logic layer 15, a node 20 of the first portion 18 of the net 16, and a node 21 of the second portion 19 of the net 16.

The net 16 represents a relation in which the second to the fourth buffer circuit cell 12 to 14 are connected to each other in parallel, and the first buffer cell 11 is connected in series to the second to the fourth circuit buffer cell 12 to 14. The first portion 18 and the second portion 19 of the net 16 have different distinguishing information.

Figure 4:
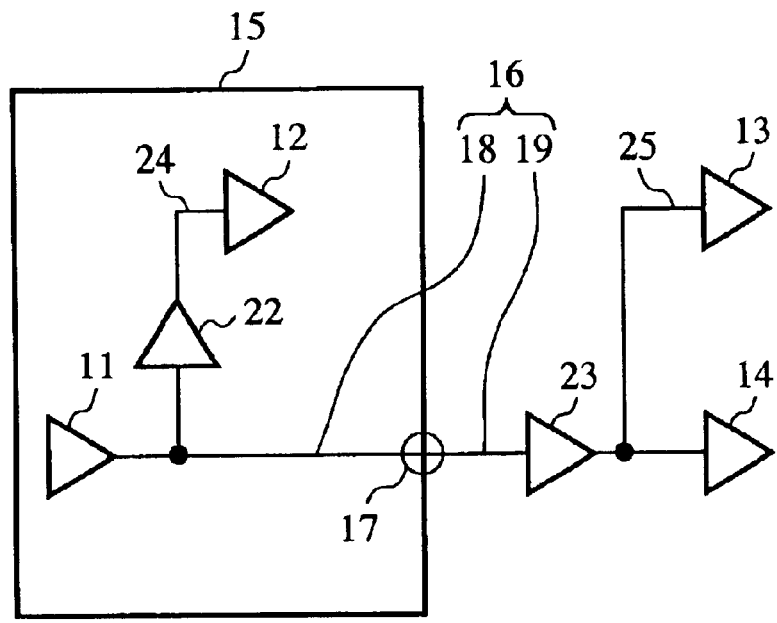
FIG. 4 is a diagram illustrating an example of the contents defined in the net list of a logic circuit after a logic optimization in this invention.

FIG. 4 illustrates an example of the contents defined in the net list of a logic circuit after a logic optimization in this invention. In FIG. 4, there are shown a first added buffer circuit cell 22 that is added to the net 16 in order to improve the routing delay from the first buffer circuit cell 11 to the second buffer circuit cell 12, a second added buffer circuit cell 23 that is added to the net 16 in order to improve the routing delay from the first buffer circuit cell 11 to the third buffer circuit cell 13, a newly produced net 24 by the first buffer circuit cell 22 being added to the net 16, and a newly produced net 25 by the second buffer circuit cell 23 being added to the net 16. The other components are identical or equal to those illustrated with the same symbols in FIG. 3, and the detailed explanations thereof will be omitted.

The net 16 shows that the first buffer circuit cell 11 and the third buffer circuit cell 13 and the first added buffer circuit cell 22 are on a connectional relation, the net 24 shows that the first added buffer circuit cell 22 and the second buffer circuit cell 12 are put in a connectional relation, and the net 25 shows that the second added buffer circuit cell 23 and the third buffer circuit cell 13 and the fourth buffer circuit cell 14 are put in a connectional relation.

Figure 5:
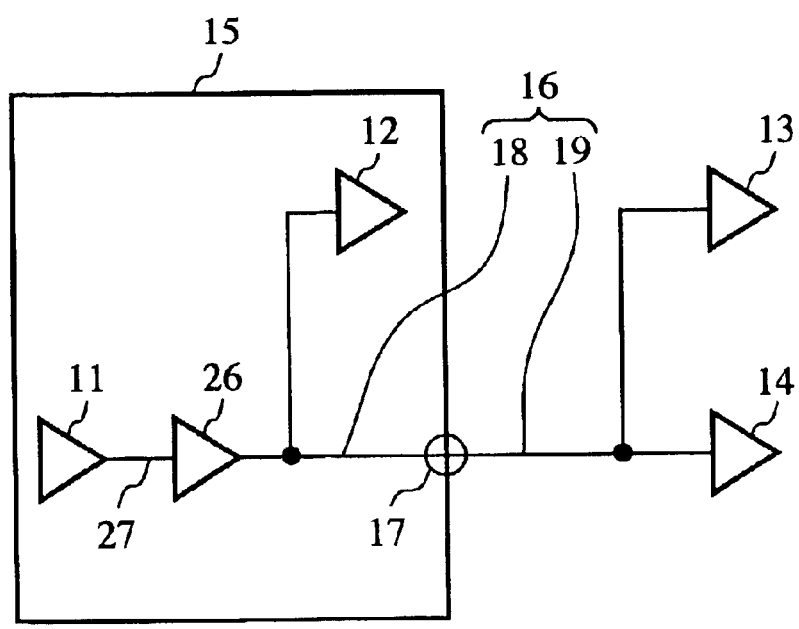
FIG. 5 is a diagram illustrating another example of the contents defined in the net list of a logic circuit after a logic optimization in this invention.

FIG. 5 illustrates another example of the contents defined in the net list of a logic circuit after a logic optimization in this invention. In FIG. 5, there are shown a third added buffer circuit cell 26 that is added to the net 16 in order to improve the routing delay from the first buffer circuit cell 11 to the second buffer circuit cell 12 and the third buffer circuit cell 13, and a newly produced net 27 by the third buffer circuit cell 26 being added to the net 16. The other components are identical or equal to those illustrated with the same symbols in FIG. 3, and the detailed explanations thereof will be omitted. The net 16 shows that the third added buffer circuit cell 26, the second buffer circuit cell 12, the third buffer circuit cell 13, and the fourth buffer circuit cell 14 are put in a connectional relation; and the net 27 shows that the first buffer circuit cell 11 and the third added buffer circuit cell 26 are put in a connectional relation.

In the case of FIG. 4, on the post stage of the first added buffer circuit cell 22 which is added to the net 16 that crosses the logic layer 15 is located only the second buffer circuit cell 12 that has been connected to the first portion 18 of the net 16 where the first added buffer circuit cell 22 is added. Also, on the post stage of the second added buffer circuit cell 23 which is added to the net 16 that crosses the logic layer 15 are located only the third buffer circuit cell 13 and the fourth buffer circuit cell 14 that have been connected to the second portion 19 of the net 16 where the second added buffer circuit cell 23 is added. In other words, only the second buffer circuit cell 12 that has been contained in the logic layer 15 where the first added buffer circuit cell 22 is added is located on the post stage of the first added buffer circuit cell 22 which is added to the net 16 that crosses the logic layer 15. Also, only the third buffer circuit cell 13 and the fourth buffer circuit cell 14 that have been contained in a logic layer outside the logic layer 15 where the second added buffer circuit cell 23 is added are located on the post stage of the second added buffer circuit cell 23 which is added to the net 16 that crosses the logic layer 15.

Thus in the case of FIG. 4, the logic optimization is executed so that, when a cell is added to the net 16 that crosses the logic layer 15, only the cell that has been connected to the portion having the same distinguishing information as the portion of the net 16 where the cell is added is located. Therefore, the logic optimization will not alter the number of the ports that are located on the boundary of the logic layer 15.

Figure 13:
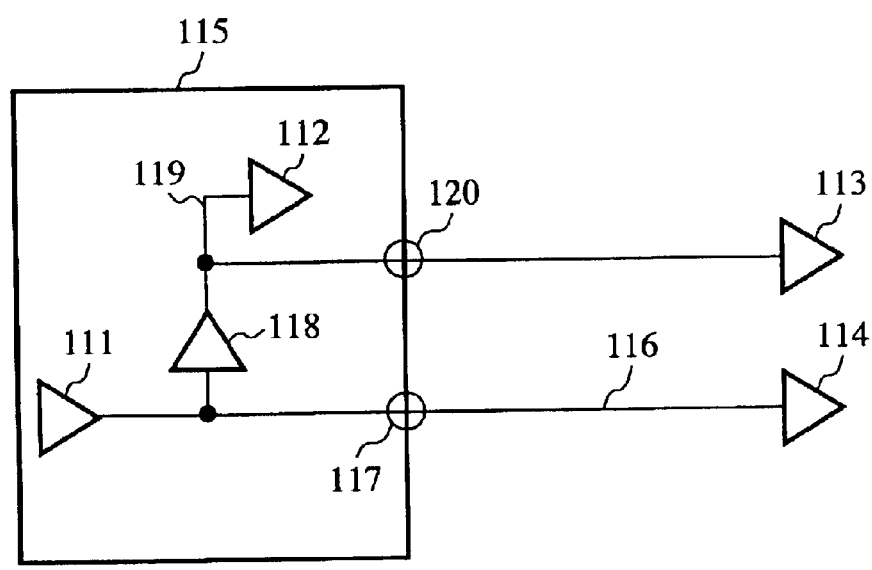
FIG. 13 is a diagram illustrating the contents defined in the; net list of a logic circuit after a logic optimization in the conventional example.

In the case of FIG. 13 on the other hand, the second buffer circuit cell 112 that has been contained in the logic layer 115 where the added buffer circuit cell 118 is located and the third buffer circuit cell 113 that has been contained in a logic layer outside the logic layer 115 where the added buffer circuit cell 118 is located are located on the post stage of the added buffer circuit cell 118 being added to the net 116 that crosses the logic layer 115. Thus, the logic optimization increases the number of the ports located on the boundary of the logic layer 115.

Further in FIG. 4, the first added buffer circuit cell 22 is interposed between the node 20 of the first portion 18 of the net 16 that crosses the logic layer 15 and the second buffer circuit cell 12; and the second added buffer circuit cell 23 is interposed between the port 17 and the node 21 of the second portion 19 of the net 16 that crosses the logic layer 15. That is, the first added buffer circuit cell 22 and the second added buffer circuit cell 23 are added so as not to alter the signal transmission paths to the first buffer circuit cell 11 and the second buffer circuit cell 12 that are contained in the logic layer 15 and the signal transmission paths to the third buffer circuit cell 13 and the fourth buffer circuit cell 14 that are contained in a logic layer outside the logic layer 15.

In the case of FIG. 5, the third added buffer circuit cell 26 is interposed between the first buffer circuit cell 11 and the node 20 of the first portion 18 of the net 16 that crosses the logic layer 15. That is, the third added buffer circuit cell 26 is added so as not to alter the signal transmission paths to the first buffer circuit cell 11 and the second buffer circuit cell 12 that are contained in the logic layer 15 and the signal transmission paths to the third buffer circuit cell 13 and the fourth buffer circuit cell 14 that are contained in a logic layer outside the logic layer 15.

Thus, in either case of FIG. 4 and FIG. 5, when a cell is added to the net 16 that crosses the logic layer 15, the logic optimization is executed in such a manner that the first portion 18 and the second portion 19 having different distinguishing information of the net 16 are not divided at the node 20 and the node 21, respectively. Accordingly, the number of the ports located on the boundary of the logic layer 15 will not change after the logic optimization.

In the case of FIG. 13, however, the signal transmission path to the third buffer circuit cell 113 contained in a logic layer outside the logic layer 115 is changed. Accordingly, the number of the ports located on the boundary of the logic layer 115 is increased.

As described above, according to the embodiment 1, since the automatic placement and routing apparatus executes a logic optimization so as not to alter the number of the ports located on the boundary of the logic layer by using the distinguishing information, it is able to utilize the same test patterns before and after a logic optimization, thus achieving an effective use of the test patterns.

Further, the automatic placement and routing apparatus according to the embodiment 1 executes a logic optimization, each time a cell forming a specific region of a logic circuit is arranged, which effects an efficient logic optimization.

Embodiment 2

Figure 6:
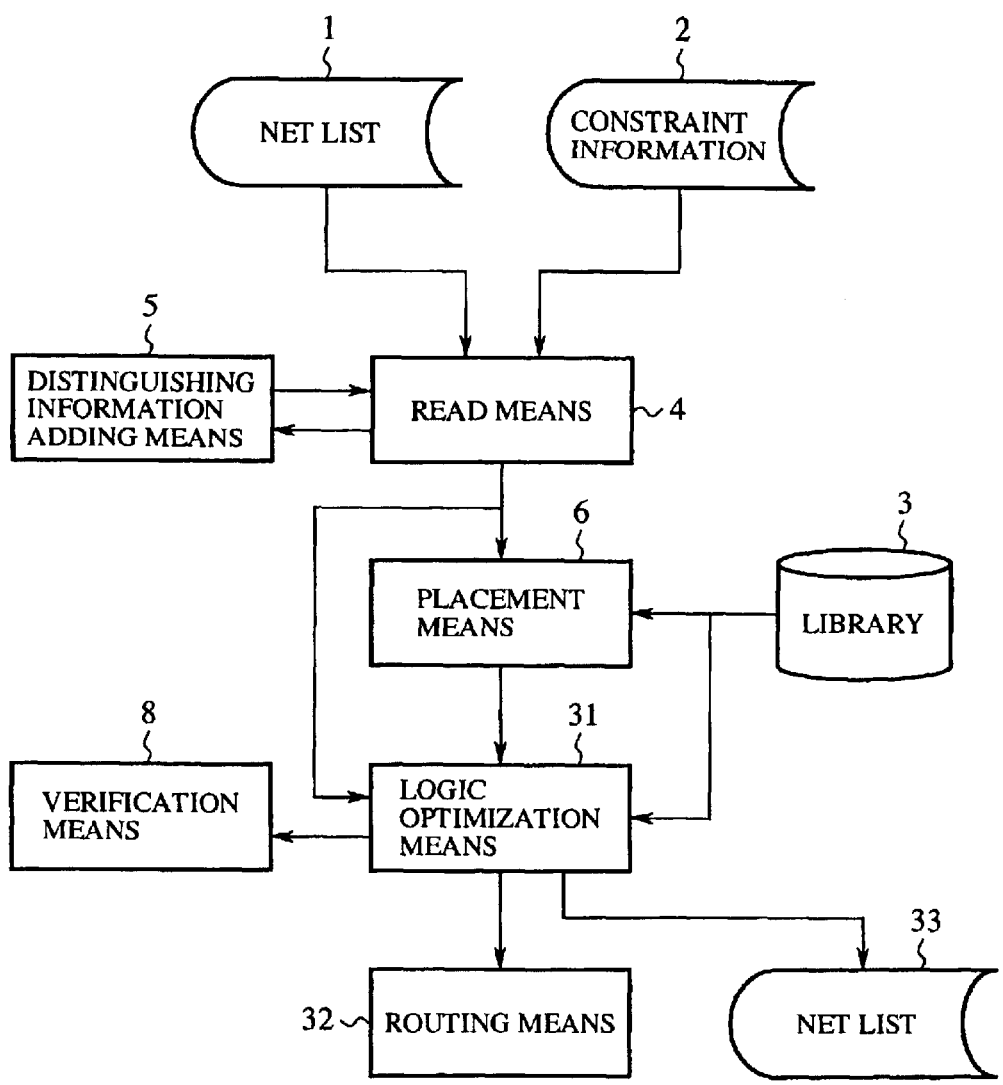
FIG. 6 is a block diagram illustrating an automatic placement and routing apparatus according to an embodiment 2 of this invention.

FIG. 6 illustrates a block diagram of an automatic placement and routing apparatus according to an embodiment 2 of the invention. In FIG. 6, numeral 31 designates a logic optimization means that, after the placement means 6 places the cells constituting a logic circuit, analyzes the layout of the logic circuit, executes a logic optimization that rewrites the net list 1, in such a manner that the number of ports located on the boundary of the logic layer cannot be altered by using the distinguishing information, and that the various constraints defined in the constraint information 2 can be met, and modifies the layout of the logic circuit on the basis of a rewritten net list (logic circuit information) 33. Numeral 32 designates a routing means that, after the logic optimization means 31 executes the logic optimization and the layout modification, routes the cells so as to satisfy the connectional relations defined in the rewritten net list 33. The logic optimization means 31 outputs the rewritten net list 33. The other components are identical or equal to those illustrated with the same symbols in FIG. 1, and the detailed explanations thereof will be omitted.

Specifically, when a cell is added to a net crossing the logic layer through the logic optimization, the logic optimization means 31 executes the logic optimization in the same manner as the embodiment 1, such that only the cell connected to a portion of the net having the same distinguishing information as that of the net where the cell is added is located on the post stage of the added cell. Alternatively, the logic optimization means 31 executes a logic optimization in such a manner that one portion having distinguishing information with the port located on the boundary of the logic layer in the net as the boundary and the other portion having different distinguishing information from that of the one portion are not divided at each of the nodes.

Next, the operation will be described.

Figure 7:
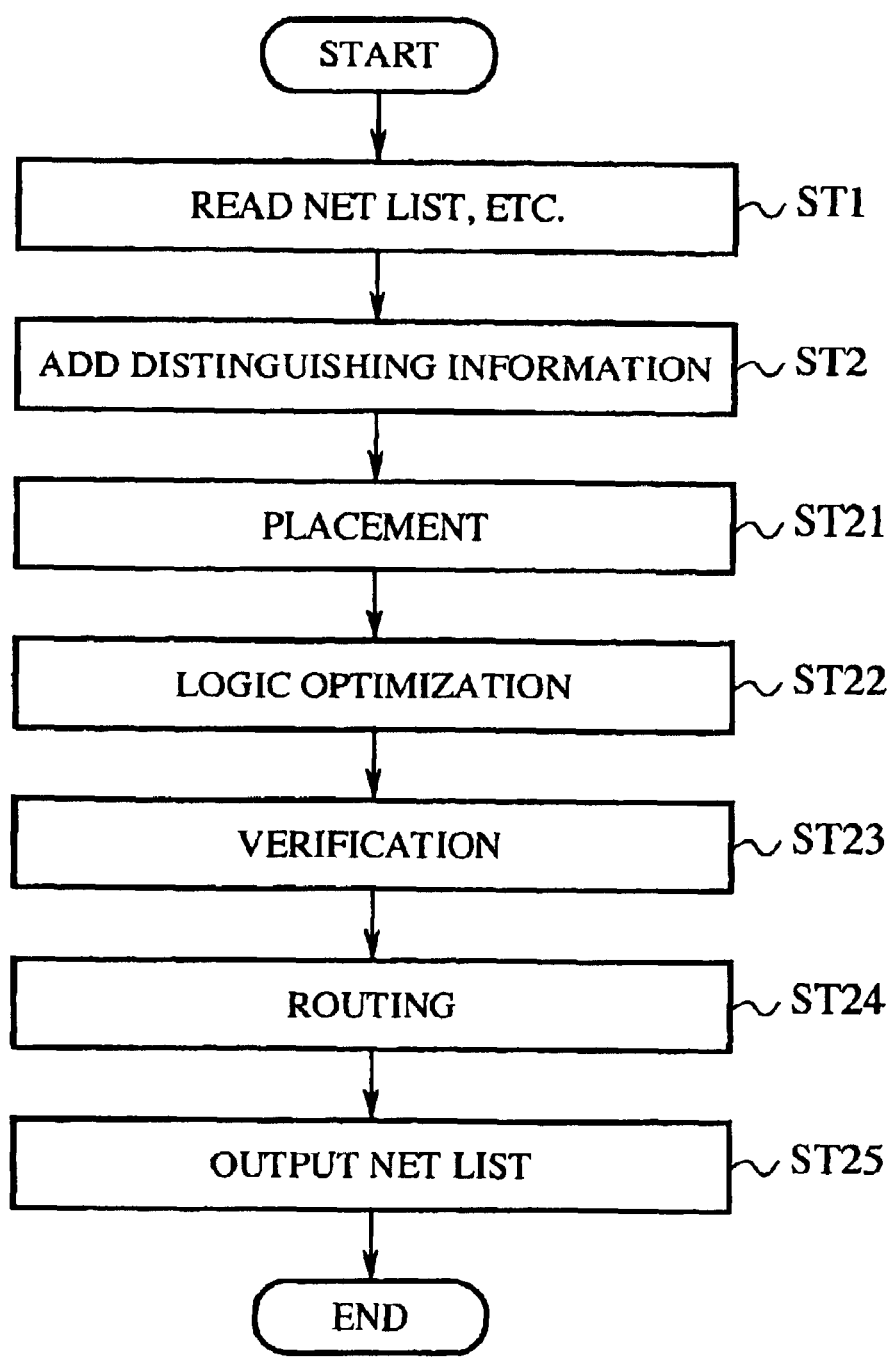
FIG. 7 is a flow chart illustrating an automatic placement and routing method according to the embodiment 2 of this invention.

FIG. 7 illustrates a flow chart of an automatic placement and routing method according to the embodiment 2 of the invention.

The method carries out the steps until step ST2 in the same manner as the embodiment 1.

Thereafter, the placement means 6 fetches the net list 1 from the read means 4, and then, on the basis of the net list 1, the means 6 places the cells registered in the library 3 (step ST21).

After the placement means 6 places the cells constituting a logic circuit, the logic optimization means 31 fetches the net list 1 and the constraint information 2 from the read means 4. Subsequently, the logic optimization means 31 analyzes the layout of the logic circuit, executes a logic optimization that rewrites the net list 1, in such a manner that the number of ports located on the boundary of the logic layer cannot be altered by using the distinguishing information, and that the various constraints defined in the constraint information 2 can be met, and modifies the layout of the logic circuit on the basis of the rewritten net list 33 (step ST22). The net list 1 can be rewritten, for example, by a new cell and net being added. The layout of the logic circuit can be modified, for example, by a new cell being laid out.

Thereafter, the verification means 8 verifies that the logic optimization has not altered the number of the ports located on the boundary of the logic layer (step ST23).

After the logic optimization means 31 executes a logic optimization and a layout modification, the routing means 32 routes the cells so as to satisfy the connectional relations defined in the rewritten net list 33 (step ST24).

Subsequently, the logic optimization means 31 outputs the rewritten net list 33 (step ST25).

The step ST24 and ST25 may be replaced in the order.

In the same manner as the embodiment 1, FIG. 3 represents an example of the contents defined in the net list of a logic circuit before the logic optimization, and FIG. 4 and FIG. 5 represent an example of the contents defined in the net list of a logic circuit after the logic optimization.

Thus, according to the embodiment 2, the automatic placement and routing apparatus executes the logic optimization so as not to alter the number of the ports located on the boundary of the logic layer by using the distinguishing information, and it is able to utilize the same test patterns before and after the logic optimization, thus achieving the effective use of the test patterns.

Further, since the automatic placement and routing apparatus according to the embodiment 2 executes the logic optimization, after all the cells constituting a logic circuit are arranged, it is able to effect a precise logic optimization in which the whole cell layout of the logic circuit is taken into consideration.

Embodiment 3

Figure 8:
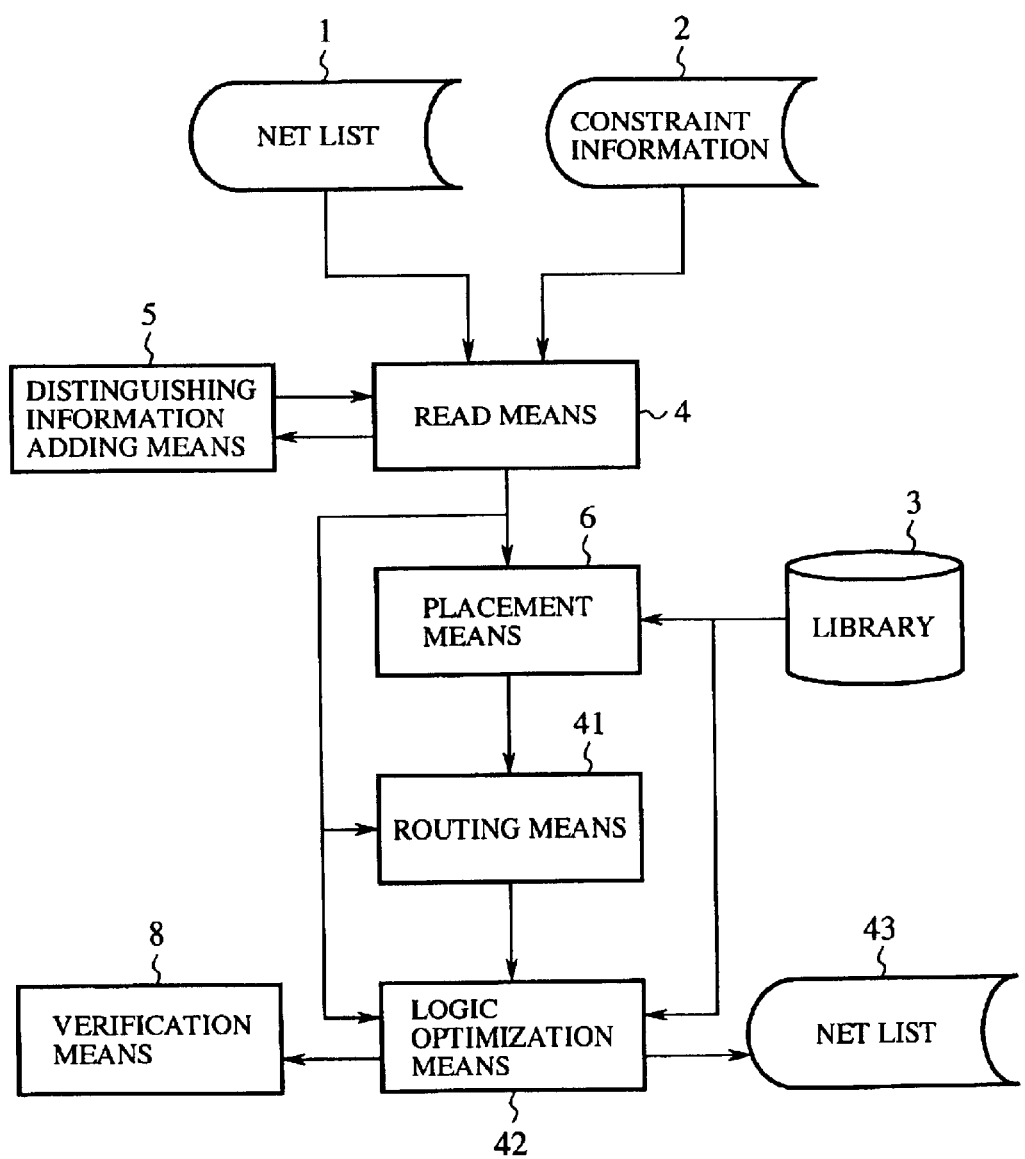
FIG. 8 is a block diagram illustrating an automatic placement and routing apparatus according to an embodiment 3 of this invention.

FIG. 8 illustrates a block diagram of an automatic placement and routing apparatus according to an embodiment 3 of the invention. In FIG. 8, numeral 41 designates a routing means that routes cells so as to satisfy the connectional relations defined in the net list 1, after the placement means 6 lays out the cells constituting a logic circuit. Numeral 42 designates a logic optimization means that, after the routing means 41 routes the cells, analyzes the layout of the logic circuit, executes a logic optimization that rewrites the net list 1, in such a manner that the number of ports located on the boundary of the logic layer cannot be altered by using the distinguishing information, and that the various constraints defined in the constraint information 2 can be met, and modifies the layout of the logic circuit on the basis of a rewritten net list (logic circuit information) 43. The logic optimization means 42 outputs the rewritten net list 43. The other components are identical or equal to those illustrated with the same symbols in FIG. 1, and the detailed explanations thereof will be omitted.

Specifically, when a cell is added to a net crossing the logic layer through a logic optimization, the logic optimization means 42 executes a logic optimization in the same manner as the embodiment 1, such that only the cell connected to a portion of the net having the same distinguishing information as that of the net where the cell is added is located on the post stage of the added cell. Alternatively, the logic optimization means 42 executes a logic optimization in such a manner that one portion having distinguishing information with the port located on the boundary of the logic layer in the net as the boundary and the other portion having different distinguishing information from that of the one portion are not divided at each of the nodes.

Next, the operation will be described.

Figure 9:
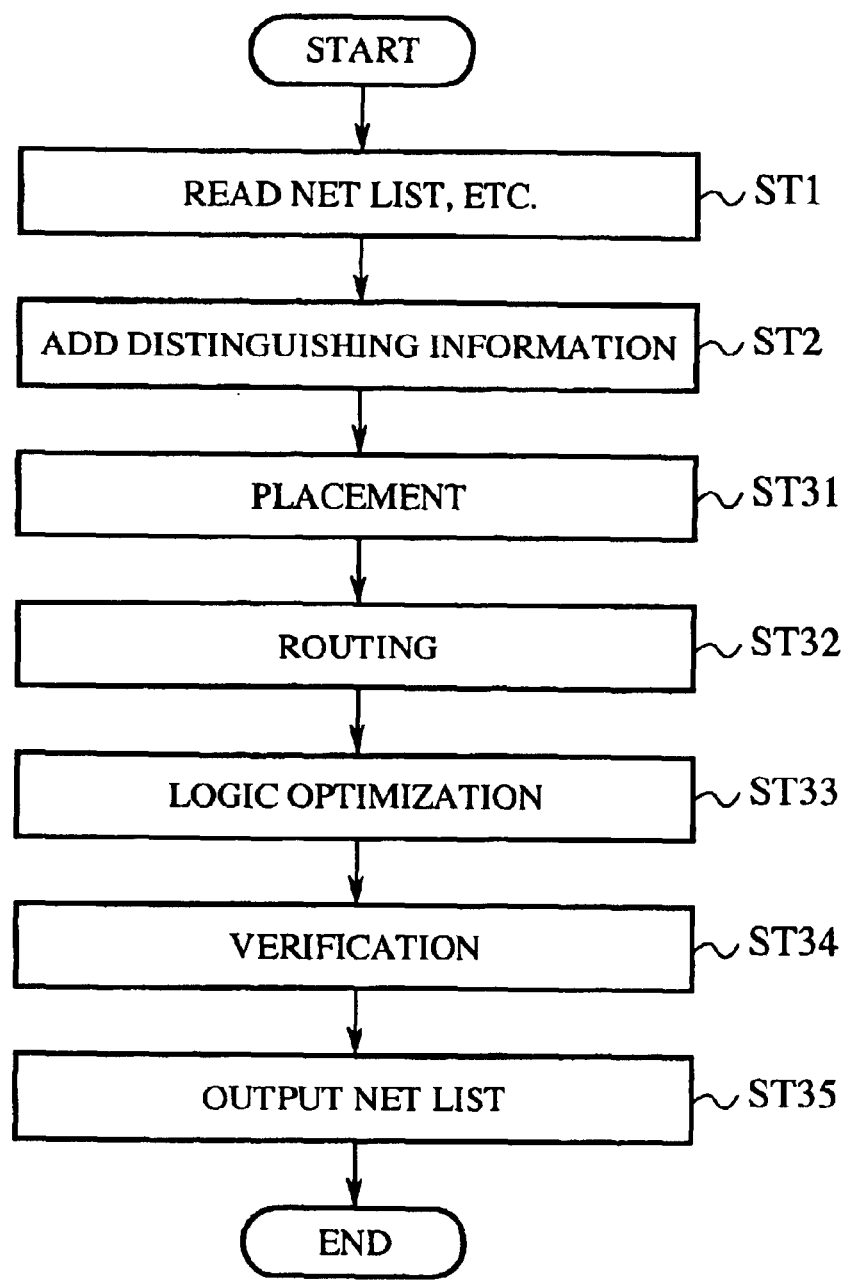
FIG. 9 is a flow chart illustrating an automatic placement and routing method according to the embodiment 3 of this invention.
Figure 10:
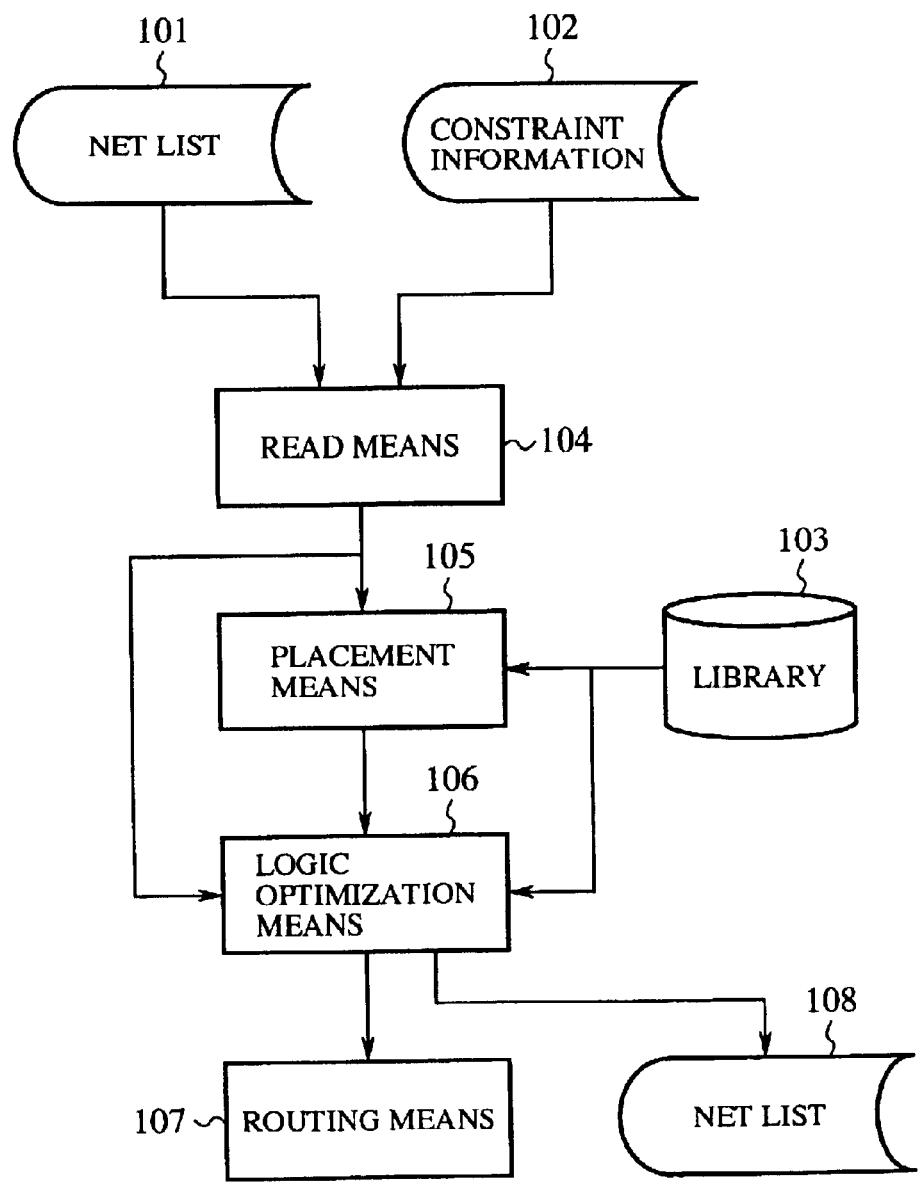
FIG. 10 is a block diagram illustrating a conventional automatic placement and routing apparatus.
Figure 11:
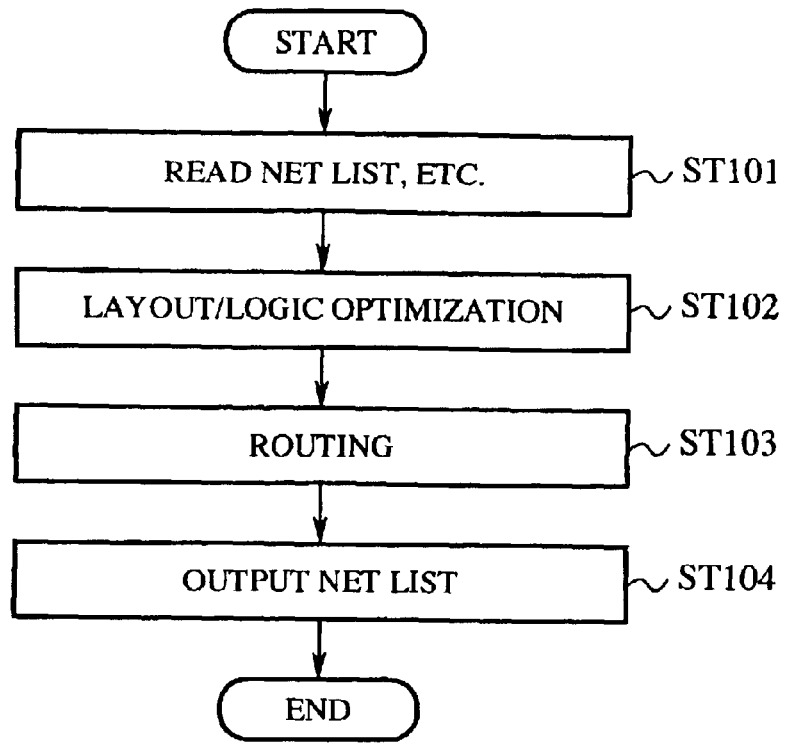
FIG. 11 is a flow chart illustrating a conventional automatic placement and routing method.
Figure 12:
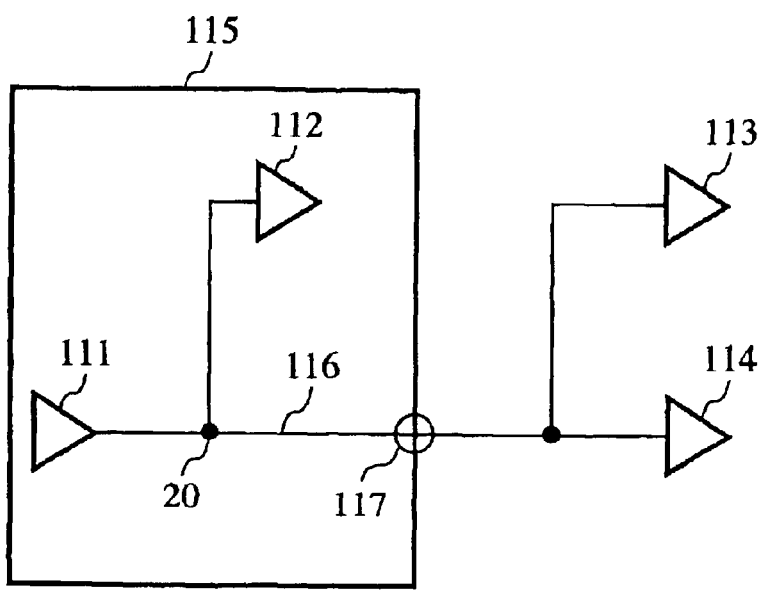
FIG. 12 is a diagram illustrating the contents defined in the net list of a logic circuit before a logic optimization in the conventional example.

FIG. 9 illustrates a flow chart of an automatic placement and routing method according to the embodiment 3 of the invention.

The method carries out the steps until step ST2 in the same manner as the embodiment 1.

Thereafter, the placement means 6 fetches the net list 1 from the read means 4, and then, on the basis of the net list 1, the means 6 places the cells registered in the library 3 (step ST31).

After the placement means 6 places the cells constituting a logic circuit, the routing means 41 fetches the net list 1 from the read means 4. Subsequently, the routing means 41 routes the cells so as to satisfy the connectional relations defined in the net list 1 (step ST32).

After the routing means 41 routes the cells, the logic optimization means 42 fetches the net list 1 and the constraint information 2 from the read means 4. Subsequently, the logic optimization means 42 analyzes the layout of the logic circuit, executes a logic optimization that rewrites the net list 1, in such a manner that the number of ports located on the boundary of the logic layer cannot be altered by using the distinguishing information, and that the various constraints defined in the constraint information 2 can be met, and modifies the layout of the logic circuit on the basis of the rewritten net list 43 (step ST33). The net list 1 can be rewritten, for example, by a new cell and net being added. The layout of the logic circuit can be modified, for example, by a new cell and wiring being laid out.

Thereafter, the verification means 8 verifies that the logic optimization has not altered the number of the ports located on the boundary of the logic layer (step ST34).

Subsequently, the logic optimization means 42 outputs the rewritten net list 43 (step ST35).

The step ST34 and ST35 may be replaced in the order.

In the same manner as the embodiment 1, FIG. 3 represents an example of the contents defined in the net list of a logic circuit before the logic optimization, and FIG. 4 and FIG. 5 represent an example of the contents defined in the net list of a logic circuit after the logic optimization.

Thus, according to the embodiment 3, the automatic placement and routing apparatus executes a logic optimization so as not to alter the number of the ports located on the boundary of the logic layer by using the distinguishing information, and it is able to utilize the same test patterns before and after a logic optimization, thus achieving the effective use of the test patterns.

Further, since the automatic placement and routing apparatus according to the embodiment 3 executes a logic optimization after completing the routings between the cells, it is able to perform a more precise logic optimization in which the routings between the cells are taken into consideration.

Further, the automatic placement and routing apparatus and method described in the foregoing embodiments can be materialized by incorporating an automatic placement and routing program into a computer.

What is claimed is:

1. An automatic placement and routing apparatus comprising:
- a placement means that places cells registered in a library, on the basis of logic circuit information in which are specified information concerning the cells constituting a logic circuit, information concerning nets defining connectional relations between the cells constituting the logic circuit, and information concerning a logic layer that segments the logic circuit into appropriate sizes;
- a routing means that routes the cells so as to satisfy connectional relations defined in the logic circuit information;
- a distinguishing information adding means that analyzes the logic circuit information, and adds distinguishing information that differentiates one portion with a port located on a boundary of a logic layer on a net crossing the logic layer as the boundary from another portion to each of the portions; and
- a logic optimization means that executes a logic optimization to rewrite the logic circuit information, in such a manner that the number of ports located on the boundary of the logic layer is not altered by using the distinguishing information.

2. The automatic placement and routing apparatus according to claim 1, wherein, each time a cell forming a specific region of a logic circuit is arranged by the placement means, the logic optimization means analyzes a layout of the logic circuit in that region, executes a logic optimization to rewrite the logic circuit information of the logic circuit in that region in such a manner that the number of ports located on the boundary of the logic layer is not altered by using the distinguishing information, and modifies the layout of the logic circuit in that region on the basis of rewritten logic circuit information; and
- after the logic optimization means executes the logic optimization and the layout modification over the entire logic circuits, the routing means routes the cells so as to satisfy the connectional relations defined in the logic circuit information of all the rewritten logic circuits.

3. The automatic placement and routing apparatus according to claim 1, wherein, after the cells constituting a logic circuit are arranged by the placement means, the logic optimization means analyzes a layout of the logic circuit, executes a logic optimization to rewrite the logic circuit information in such a manner that the number of ports located on the boundary of the logic layer is not altered by using the distinguishing information, and modifies the layout of the logic circuit on the basis of the rewritten logic circuit information; and
- after the logic optimization means executes the logic optimization and the layout modification, the routing means routes the cells so as to satisfy the connectional relations defined in the rewritten logic circuit information.

4. The automatic placement and routing apparatus according to claim 1, wherein, after the routing means routes the cells, the logic optimization means analyzes a layout of the logic circuit, executes a logic optimization to rewrite the logic circuit information in such a manner that the number of ports located on the boundary of the logic layer is not altered by using the distinguishing information, and modifies the layout of the logic circuit on the basis of the rewritten logic circuit information.

5. The automatic placement and routing apparatus according to claim 1, wherein, when a logic optimization adds a cell to a net crossing the logic layer, the logic optimization means executes the logic optimization in such a manner that only the cell connected to a portion of the net having the same distinguishing information as that of the net where the cell is added is located on the post stage of the added cell.

6. The automatic placement and routing apparatus according to claim 1, wherein, when a logic optimization adds a cell to a net crossing the logic layer, the logic optimization means executes the logic optimization in such a manner that one portion having distinguishing information with a port located on the boundary of the logic layer in the net as the boundary and the other portion having different distinguishing information from that of the one portion are not divided at each of the nodes.

* * * * *